United States Patent
Weier et al.

(10) Patent No.: US 10,535,400 B2
(45) Date of Patent: Jan. 14, 2020

(54) LEVEL SHIFTING DYNAMIC WRITE DRIVER

(71) Applicant: Apple Inc., Cupertino, CA (US)

(72) Inventors: William R. Weier, Austin, TX (US); Steven Frederick Schicht, Austin, TX (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/939,078

(22) Filed: Mar. 28, 2018

(65) Prior Publication Data
US 2019/0080748 A1    Mar. 14, 2019

Related U.S. Application Data

(60) Provisional application No. 62/557,341, filed on Sep. 12, 2017.

(51) Int. Cl.
*G11C 11/00* (2006.01)
*G11C 11/419* (2006.01)
*G11C 7/22* (2006.01)

(52) U.S. Cl.
CPC .............. *G11C 11/419* (2013.01); *G11C 7/22* (2013.01)

(58) Field of Classification Search
CPC ................................ G11C 11/419; G11C 7/22
USPC ........................................................ 365/156
See application file for complete search history.

(56) References Cited

U.S. PATENT DOCUMENTS

| | | | |
|---|---|---|---|
| 6,545,521 B2 | 4/2003 | Dale | |
| 6,667,648 B2 | 12/2003 | Stout | |
| 7,005,908 B2 | 2/2006 | Lee | |
| 7,417,481 B2 | 8/2008 | Ahsanullah | |
| 7,528,628 B2 | 5/2009 | Huang | |
| 8,723,551 B2 | 5/2014 | Cho | |
| 8,816,749 B2 | 8/2014 | Alessandro | |
| 10,187,061 B1 | 1/2019 | Venugopal et al. | |
| 2012/0187998 A1 | 7/2012 | Jarrar | |
| 2018/0218177 A1* | 8/2018 | Kuenemund | G06F 21/72 |

FOREIGN PATENT DOCUMENTS

KR            100528546 B1    11/2005

* cited by examiner

*Primary Examiner* — Huan Hoang
(74) *Attorney, Agent, or Firm* — Meyertons Hood Kivlin Kowert and Goetzel PC; Rory D. Rankin

(57) ABSTRACT

Systems, apparatuses, and methods for efficiently driving level shifted write data are described. In various embodiments, a level-shifting write driver combines a write data bit and a write mask bit that each use a first supply voltage to indicate a logic high level. During a write operation, the driver generates complementary values on two output nodes based on the write data bit. The output nodes use a second supply voltage greater than the first supply voltage. Before a write operation, the driver precharges each of the two output nodes to the second supply voltage. When the write clock enables a write operation and the write mask bit disables the write operation, the level-shifting write driver puts the two output nodes in a tri-state.

20 Claims, 4 Drawing Sheets

LEVEL SHIFTING DYNAMIC WRITE DRIVER

CROSS REFERENCE TO RELATED APPLICATIONS

This application claims priority to Provisional Patent Application Ser. No. 62/557,341 entitled "Level Shifting Dynamic Write Driver", filed Sep. 12, 2017, the entirety of which is incorporated herein by reference.

BACKGROUND

Technical Field

Embodiments described herein relate to the field of computing systems and, more particularly, to efficiently driving level shifted write data.

Description of the Related Art

Generally speaking, a variety of computing systems include one or more processors and a memory, and the processors generate access requests for instructions and application data while processing one or more software applications. The one or more processors may include a central processing unit (CPU), data parallel processors like graphics processing units (GPUs), digital signal processors (DSPs), and so forth. When fetching instructions and data, the processors check a hierarchy of local cache memories. Static random access memory (SRAM) is commonly used for the memory.

The SRAM includes an array of many bit cells and a logic portion used for accessing values stored in the array. At times, the number of software applications simultaneously running on the computing system reaches an appreciable number. Therefore, the amount of instructions and data being used for processing the multiple software applications appreciably grows. Larger memory arrays provide a larger number of bit cells for storing the amount of data and instructions processed by the one or more processors. However, the on-die floorplan, especially for mobile devices, has limited area for the memory arrays. In addition, design requirements for power consumption and noise sensitivity limit the number of bit cells.

In view of the above, methods and mechanisms for efficiently driving level shifted write data are desired.

SUMMARY

Systems and methods for efficiently driving level shifted write data are contemplated. In various embodiments, a computing system includes at least one processor and a memory. In some embodiments, the memory is one level of a multi-level cache hierarchy, and each one of the memory bit cells is a copied variation of a static random access memory (SRAM) cell. In various embodiments, the memory comprises one or more arrays, read columns, write columns, level-shifting write drivers, and latches for read data, write data and write mask data. Row decoders select the memory line to be accessed based on the received request address. Write data is driven from block into array and written into a portion of the selected row. The portion is selected by column decoders.

The level-shifting write drivers replace conventional write data level shifters and write mask level shifters. In an embodiment, one or more bits of the write data and the write mask data are shifted by redundancy logic external to the level-shifting write drivers. The redundancy logic uses a first supply voltage that is lower than a second supply voltage used by the memory arrays. Each of the level-shifting write drivers includes an input interface for receiving a write data bit, a write mask bit, and a write clock signal. Each of the multiple signals use the first supply voltage to indicate a Boolean logic high level. A Boolean logic high level is also referred to as a logic high level. Similarly, a Boolean logic low level is also referred to as a logic low level. In various embodiments, each of the level-shifting write drivers includes circuitry for shifting a logic high level of the clock signal from the first supply voltage to the second supply voltage used by the memory array.

In some embodiments, the circuitry within the level-shifting write driver generates an intermediate signal by combining the write data bit, the write mask bit and the clock signal. The generated intermediate signal uses the first supply voltage to indicate a logic high level despite the clock signal indicates a logic high level with the second supply voltage. The intermediate signal is used to generate values on the two output nodes. For example, in an embodiment, when the intermediate signal reaches a logic high level indicated by the first supply voltage, an nfet receiving the intermediate signal on its gate input discharges a node connected to a gate input of a pfet. The pfet charges one of the two output nodes to a logic high level indicated by the second supply voltage. The pfet has its source terminal connected to the second supply voltage.

In response to detecting each of the write clock and the write mask bit enables a write operation, the level-shifting write driver generates two values on the two output nodes based on the write data bit. The two values are complementary values with respect to one another. As used herein, two values being complementary to one another refers to one of the two values having a logic high level and the other one of the two values having a logic low level. In various embodiments, the memory array supply voltage is used to provide the logic high level of the two complementary values. In an embodiment, the ground reference is used to provide the logic low level. In various embodiments, the output node connected to the storage cell on the side storing the non-inverted data value within the storage cell has a same logic level as the input write data bit. In contrast, the other output node connected to the storage cell on the side storing the inverted data value has a complementary value of the input write data bit. In some embodiments, the storage cell is a SRAM bit cell.

When the write clock enables a write operation, the write clock may be considered to be asserted. In some embodiments, the write clock is negated when the write clock has a logic high level and the write clock is asserted when the write clock has a logic low level. In other embodiments, the write clock is negated when the write clock has a logic low level and the write clock is asserted when the write clock has a logic high level. In response to detecting the write clock signal is negated, the level-shifting write driver precharges each of two output nodes. In various embodiments, the level-shifting write driver precharges the two output nodes to a voltage value equal to the memory array supply voltage.

In response to detecting the write clock enables a write operation and the write mask bit does not enable a write operation, the level-shifting write driver prevents driving the two output nodes to either a logic low level or a logic high level. In other words, the two output nodes are put in an undriven state (tri-state) to prevent a memory cell in the memory array from being written. The two output nodes are eventually driven to two values complementary to one another by the external random access memory (RAM) bit cell in the memory array.

BRIEF DESCRIPTION OF THE DRAWINGS

The above and further advantages of the methods and mechanisms may be better understood by referring to the following description in conjunction with the accompanying drawings, in which.

Figure 1:
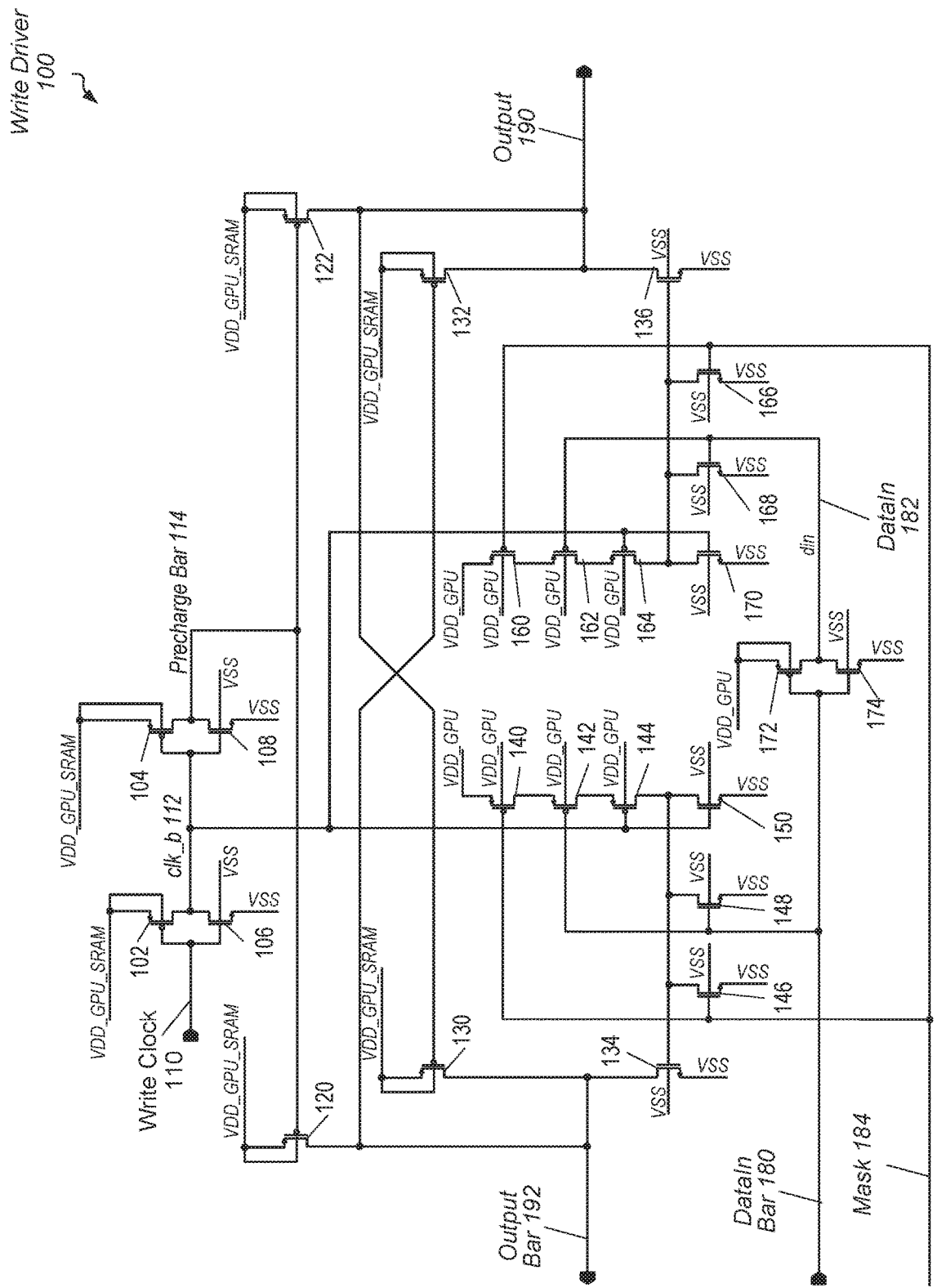
FIG. 1 is a block diagram of one embodiment of a level shifting write driver.

While the embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112(f) for that unit/circuit/component.

DETAILED DESCRIPTION OF EMBODIMENTS

In the following description, numerous specific details are set forth to provide a thorough understanding of the embodiments described in this disclosure. However, one having ordinary skill in the art should recognize that the embodiments might be practiced without these specific details. In some instances, well-known circuits, structures, and techniques have not been shown in detail for ease of illustration and to avoid obscuring the description of the embodiments.

Turning to FIG. 1, a generalized block diagram illustrating one embodiment of a level shifting write driver 100 is shown. In the illustrated embodiment, write driver 100 receives write clock 110, DataIn Bar 180 and Mask 184, and write driver 100 generates Output 190 and OutputBar 192. Write driver 100 receives two supply voltages. A first supply voltage is indicated by "VDD_GPU," which is also referred to as a first voltage. A second supply voltage is indicated by "VDD_GPU_SRAM," which is also referred to as a second voltage. The second voltage is greater than the first voltage. Write driver 100 also uses a ground reference indicated by "VSS."

When write clock 110 is at a logic low level, the transistors 102 and 106 generate a logic high level for clk_b 112 and transistors 104 and 108 generate a logic low level for Precharge Bar 114. As shown, each of clk_b 112 and Precharge Bar 114 uses the second voltage when indicating a logic high level. Additionally, write clock 110 uses the second voltage when indicating a logic high level. In the illustrated embodiment, the logic high level for clk_b 112 turns off transistors 144 and 164 while turning on transistors 150 and 170. As shown, write driver 100 generates a first intermediate signal on the gate input of transistor 134 by combining DataIn Bar 180, Mask 184 and clk_b 112 with transistors 140-144 and transistors 146-150. For example, during a precharge stage, at least the transistor 144 is turned off and at least transistor 150 is turned on. Therefore, the gate input of transistor 134 is discharged to a logic low level and transistor 134 is turned off. Similarly, write driver 100 generates a second intermediate signal on the gate input of transistor 136 by combining DataIn Bar 180, Mask 184 and clk_b 112 with transistors 160-164 and transistors 166-170. For example, during a precharge stage, at least the transistor 164 is turned off and at least transistor 170 is turned on. Therefore, the gate input of transistor 136 is discharged to a logic low level and transistor 136 is turned off. In the illustrated embodiment, a logic low level for Precharge Bar 114 turns on transistors 120 and 122, which charge the two output nodes 190 and 192 to a logic high level using the second voltage.

When write clock 110 is at a logic high level, the transistors 102 and 106 generate a logic low level for clk_b 112 and transistors 104 and 108 generate a logic high level for Precharge Bar 114. The logic low level for clk_b 112 turns on transistors 144 and 164 while turning off transistors 150 and 170. If the input mask 184 is at a logic high level, then transistors 146 and 166 are turned on while transistors 140 and 160 are turned off. Transistor 146 discharges the gate input to transistor 134 and turns it off. Similarly, transistor 166 discharges the gate input to transistor 136 and turns it off. Therefore, regardless of the value of input DataIn Bar 180, the two output nodes 190 and 192 have a tri-state (undriven) value based on the circuitry for write driver 100. In the tri-state mode, the two output nodes 190 and 192 are connected to a random access memory (RAM) bit cell. The stored value helps drive the output nodes 190 and 192 to opposite logic values. In one example, Output Bar 192 is discharged to the ground reference by the stored value. Consequently, the gate input of pfet 132 is also discharged and pfet 132 is turned on, which charges the node Output 190 to a logic high level using the second supply voltage. In another example, the opposite scenario occurs where Output 190 is discharged to the ground reference by the stored value. Consequently, the gate input of pfet 130 is also discharged and pfet 130 is turned on, which charges the node Output Bar 192 to a logic high level using the second supply voltage.

When the write clock 110 is at a logic high level and the input mask 184 is at a logic low level, each of the write clock 110 and the write mask bit 184 enables a write operation. Accordingly, the level-shifting write driver 100 generates two values on the two output nodes 190 and 192 based on the write data bit. The two values generated on the output nodes 190 and 192 are complementary to one another. In some embodiments, the write data bit and the value of input DataIn Bar 180 are complementary values. For example, in an embodiment, the write data bit is stored in a storage element and the output value of the storage element is inverted prior to being received as DataIn Bar 180. In other embodiments, the inverted value of the write data bit is stored in the storage element and a non-inverted output value of the storage element is received as DataIn Bar 180. In various embodiments, the output node 190 is connected to the storage cell on the side storing the non-inverted data value within the storage cell. A logic level generated on output node 190 is equal to the input write data bit, since the input write data bit is the value to be written into the storage cell. Therefore, the output node 190 and the received input DataIn Bar 180 are complementary values. The output node 192 is connected to the storage cell on the side storing the inverted data value within the storage cell. A logic level generated on output node 192 and the input write data bit are complementary values, since the complementary value of the input write data bit is used to be written into inverting side of the storage cell. Therefore, the output node 192 is equal to the received input DataIn Bar 180.

Again, when the write clock 110 is at a logic high level and the input mask 184 is at a logic low level, each of the write clock 110 and the write mask bit 184 enables a write operation. With a logic high level on the received write clock 110, the node clk_b 112 is at a logic low level, and transistors 150 and 170 are turned off, whereas transistors 144 and 164 are turned on. With a logic low level on the received write mask bit 184, transistors 146 and 166 are turned off, whereas transistors 140 and 160 are turned on. Accordingly, the output nodes 190 and 192 are now dependent on the value of the received input DataIn Bar 180. As described above, the output node 190 and the received input DataIn Bar 180 are complementary values. Therefore, when DataIn Bar 180 has a logic high level, the output node 190 will have a logic low level. For example, when DataIn Bar 180 has a logic high level, transistor 148 is turned on, whereas transistor 142 is turned off. The two transistors 172 and 174 invert the value of DataIn Bar 180 and DataIn 182 has a logic low level. Consequently, transistor 168 turns off while transistor 162 turns on. The gate input of transistor 134 is discharged and transistor 134 turns off. The gate input of transistor 136 is charged by the p-type field effect transistors (pfets) 160, 162 and 164. The n-type fet (nfet) 136 turns on and discharges Output 190. Accordingly, Output 190 has a logic low level, which turns on pfet 130. Output Bar 192 is charged to the second voltage value. Accordingly, Output Bar 192 has a logic high level.

When the write clock 110 is at a logic high level and the input mask 184 is at a logic low level, again, each of the write clock 110 and the write mask bit 184 enables a write operation. Accordingly, the level-shifting write driver 100 generates two values on the two output nodes 190 and 192 based on the write data bit. As described above, the output node 190 and the received input DataIn Bar 180 are complementary values. Therefore, when DataIn Bar 180 has a logic low level, the output node 190 will have a logic high level. When DataIn Bar 180 has a logic low level, the left half of write driver 100 turns on. The pfets 140, 142 and 144 turn on nfet 134, which discharges Output Bar 192. Consequently, the pfet 132 turns on and charges Output 190 to the second voltage value. Accordingly, Output 190 has a logic high level and Output Bar 192 has a logic low level.

In an embodiment, redundancy shifting is performed at the first supply voltage prior to the write driver 100 performing the level shifting and combining. As described above, the write driver 100 combines the write clock 110, DataIn Bar 180, and mask 184 to drive only one of the output nodes 190 and 192 to a logic low level. When the write clock 110 transitions to a logic low level, the output nodes 190 and 192 are precharged to a logic high level to match the pre-charge state of the bitline and eliminate charge sharing in the next write cycle. If the mask 184 is enabled (logic high level) when write clock 110 is asserted (at a logic high level), then the output nodes 190 and 192 are put in an undriven state (tri-state) to prevent the memory cell from being written. In other words, the circuitry prevents driving the two output nodes 190 and 192 to either a logic low level or a logic high level.

Specific pfets, such as pfets 102, 104, 120, 122, 130 and 132, are connected to the correct voltage rail to ensure level shifting. In addition, write clock 110 is level shifted to ensure proper operation. The use of mask 184 allows the output nodes 190 and 192 of write driver 100 to be tri-stated during a write operation. By tri-stating the output nodes 190 and 192, the masking function eliminates power consumption from bit-cell contention. The bit-cell contention would occur if the masking function had been implemented by driving each of the output nodes 190 and 192 to a logic high level. Power consumption is further reduced by placing the majority of the data path (typically multi-byte busses) on the lower voltage rail before leveling shifting.

In addition to reducing power consumption, write driver 100 allows on-die area to be reduced since a single level shifter is used for multiple input signals. Level shifters are expensive because the two voltage rails need significant well spacing for the various PMOS devices in order to not violate DRC rules.

Figure 2:
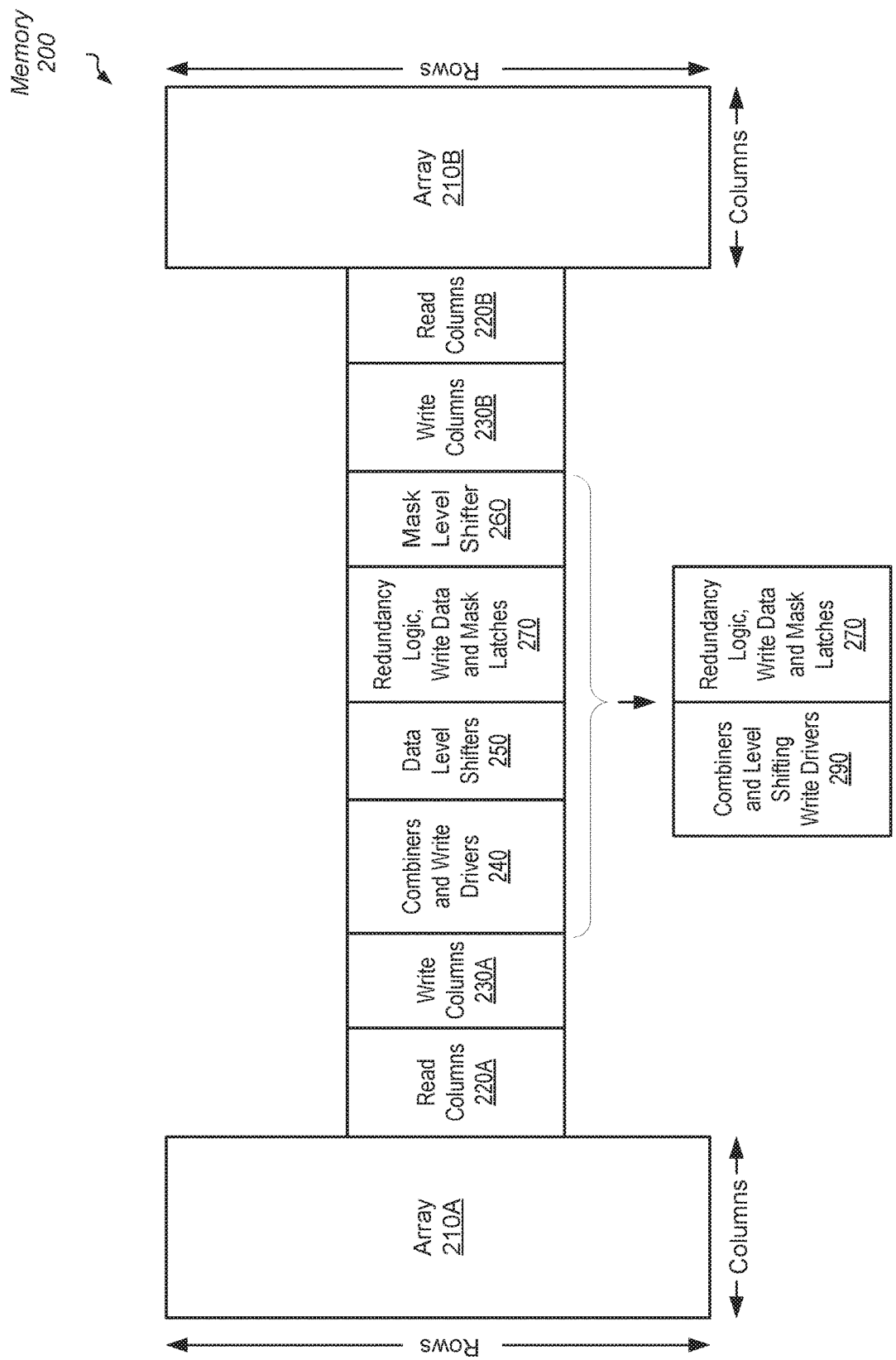
FIG. 2 is a block diagram of one embodiment of a memory.

Turning to FIG. 2, a generalized block diagram illustrating another embodiment of memory 200 is shown. In various embodiments, memory 200 comprises arrays 210A-210B, read columns 220A-220B, write columns 230A-230B, write drivers 240, data level shifters 250, mask level shifters 260 and latches 270 for write data and write mask data. The routing of received memory access requests and received control signals are not shown for ease of illustration. Similar to the memory arrays described earlier, in various embodiments, each of the arrays 210A-210B includes multiple memory bit cells arranged in a tiled format. In various embodiments, each one of the memory bit cells is a copied variation of an SRAM cell.

As shown, rows are placed in a vertical orientation in arrays 210A-210B and columns are placed in a horizontal orientation. However, the orientation of rows and columns may be switched in other embodiments. Rows may also be referred to as entries. In various embodiments, each row, or entry, stores data such as one or more memory lines. In addition, the orientation of blocks 220A-220B, 230A-230B and 240-270 may also be placed in a different orientation and/or a different location with respect to one another and with respect to arrays 210A-210B. In various embodiments, each of the blocks 220A-220B, 230A-230B and 240-270 is communicatively coupled to another one of the blocks. For example, direct connections are used wherein routing occurs through another block. Alternatively, staging of signals is done in an intermediate block.

In some embodiments, a row within the arrays 210A-210B is wider than input/output (I/O) data, which is received by memory 200 and sent by memory 200. For example, in one embodiment, a row within the arrays 210A-210B includes 256 bits, whereas the width of I/O data is 64 bits. Therefore, the arrays 210A-210B use a four-to-one selection logic, such as multiplexers, to access the correct portion of the 256-bit row. Write operations may target a finer granularity of data. In one embodiment, write operations are capable of targeting a single byte of data. Therefore, a write mask is used to specify which byte(s) of the eight bytes in the 64-bit I/O data are enabled for the write operation. The latches in block 270 receive the write data and the write mask data.

In various embodiments, memories use multiple supply voltage domains to achieve both performance for memory accesses and lower power consumption for transferring data and control signals over relatively long distances. In an embodiment, memory 200 is a dual supply rail memory, which converts data and control signals using a first supply voltage to values using a second supply voltage which is greater than the first supply voltage. Blocks 250 and 260 convert (level shift) at least the write data and the write mask data from the first supply voltage to the second supply voltage. In an embodiment, arrays 210A-210B and blocks 220A-220B, 230A-230B and 240 utilize the second supply voltage. A portion of the blocks 250 and 260 also use the second supply voltage. In an embodiment, block 270 uses the first supply voltage. In various embodiments, block 270 receives the write data and the write mask data, and stores the received data in storage elements such as latches, registers or flip-flops. The stored data are sent from block 270 to the level shifters in blocks 250 and 260.

In an embodiment, redundancy logic is located in block 270, and write data and write mask data are shifted to another column before being level shifted by blocks 250 and 260. In another embodiment, block 240 includes redundancy logic. In other embodiments, the redundancy logic is located in another block. In some embodiments, block 240 receives an indication whether the I/O data is in a repair mode. The indication may specify which column of the I/O data is a failed column. For example, if the I/O data has a width of 64 bits, then the indication may specify the 19$^{th}$ column is a failed column. In some embodiments, the indication is generated by test circuitry, test software or a combination of test hardware and software. In various embodiments, block 240 includes redundancy logic for selecting which portions of incoming information is combined with other portions of the incoming information. For example, the redundancy logic selects which portions of write data are combined with portions of write mask data based on the indication of the repair mode.

In an embodiment, block 240 includes combiners, which combines write data and write mask data based on selections performed by the redundancy logic. In some embodiments, the combiners combine write data and write mask data with Boolean AND logic on a bit-wide basis. The output values of the combiners are sent to write drivers, which send enabled write information to write columns 230A or write columns 230B based on which one of the arrays 210A-210B is being accessed. In some embodiments, write columns 230A-230B use dynamic logic, sense amplifiers, a write clock signal and timing control logic for setting up the write word line drivers and updating the write latches with new data.

Row decoders and column decoders may be placed in blocks 230A-230B or another block. Row decoders select the row, or the memory line, to be accessed based on the received request address. Write data is driven from block 230A into array 210A and written into a portion of the selected row. Similarly, write data may be driven from block 230B into array 210B and written into a portion of the selected row. In various embodiments, the column decoders select the portion being accessed in the selected row. As described earlier, the rows in arrays 210A-210B may be larger than the width of the I/O data. Selection logic within arrays 210A-210B specify the portion with the selected row. For read access requests, blocks 220A-220B are used to precharge the read lines routed to the arrays 210A-210B. Read latches and timing logic used for precharging and setting up sense amplifiers and read word line driver logic may be placed in blocks 220A-220B or another block.

In various embodiments, the combination of blocks 240-270 are replaced by the combination of blocks 290 and 270. In some embodiments, block 290 uses one or more instantiations of a write driver such as write driver 100 (of FIG. 1). Therefore, in some embodiments, level shifting of multiple input signals is performed by a single level shifter for each write data bit.

Figure 3:
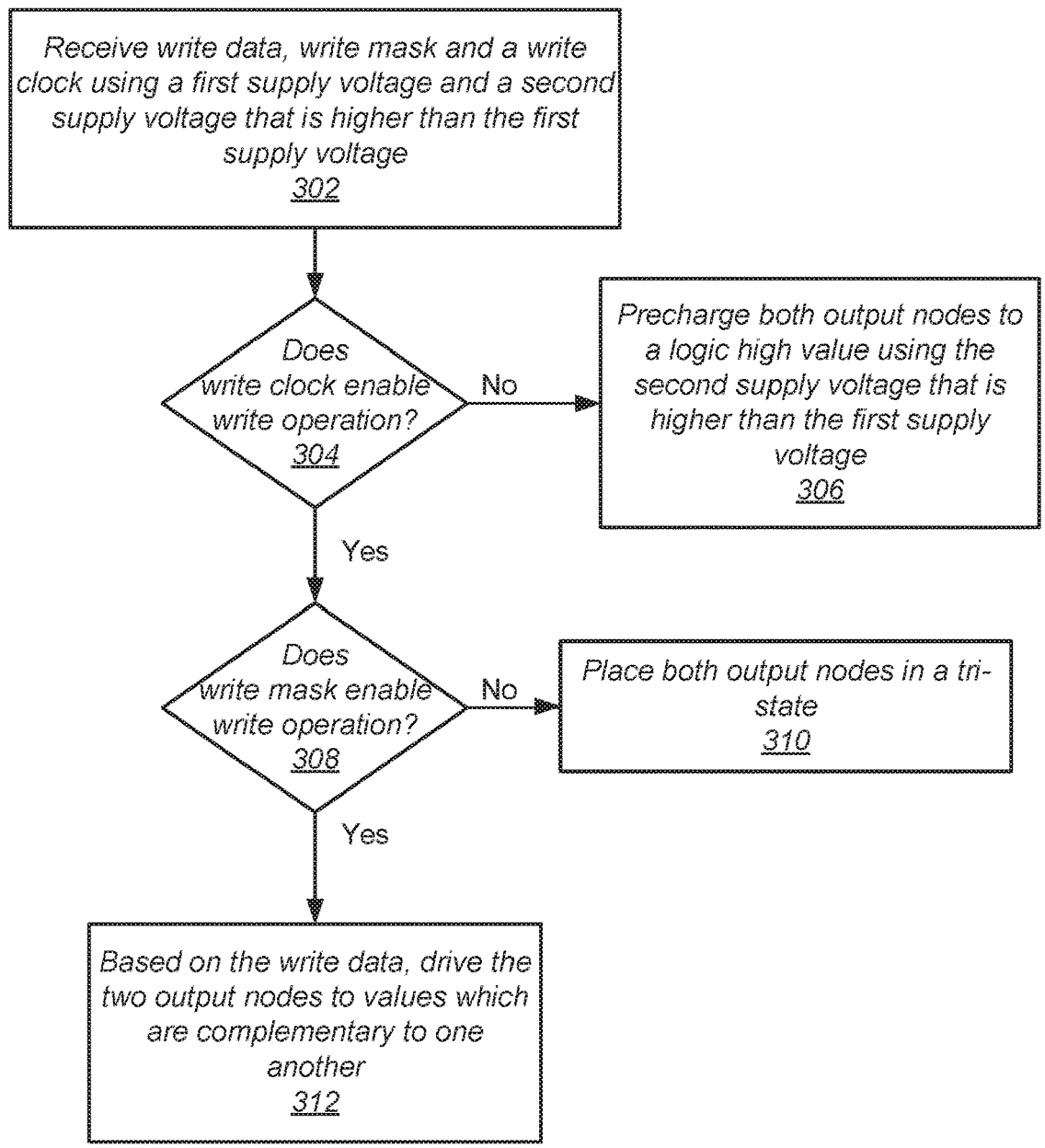
FIG. 3 is a flow diagram of one embodiment of a method for efficiently driving level shifted write data.

Referring now to FIG. 3, a generalized flow diagram of one embodiment of a method 300 for efficiently driving level shifted write data accesses is shown. For purposes of discussion, the steps in this embodiment are shown in sequential order. However, in other embodiments some steps may occur in a different order than shown, some steps may be performed concurrently, some steps may be combined with other steps, and some steps may be absent.

Each of the write data and the write mask is received using a first supply voltage (block 302). Additionally, a write clock is received using a second supply voltage higher than the first supply voltage. When the write clock disables a write operation, the write clock may be considered to be negated. When the write clock enables a write operation, the write clock may be considered to be asserted. In some embodiments, the write clock is negated when the write clock has a logic high level and the write clock is asserted when the write clock has a logic low level. In other embodiments, the write clock is negated when the write clock has a logic low level and the write clock is asserted when the write clock has a logic high level. If the write clock disables a write operation ("no" branch of the conditional block 304), then both output nodes are precharged to a logic high level using the second supply voltage that is higher than the first supply voltage (block 306). In this case, the write clock is considered to be negated, and each of the output nodes is precharged.

If the write clock is asserted ("yes" branch of the conditional block 304), and the write mask does not enable a write operation ("no" branch of the conditional block 308), then both output nodes are undriven by circuitry in the level shifting write driver, which places both output nodes at a tri-state value (block 310). In other words, the circuitry prevents driving the two output nodes to either a logic low level or a logic high level. Similar to the write clock, when the write mask bit disables a write operation, the write mask bit may be considered to be negated. As with the clock signal discussed above, in various embodiments the write mask bit may indicate negation and assertion by using either a logic low or logic high level as desired. If the write clock and the write mask both enable a write operation ("yes" branches of the conditional blocks 304 and 308), then both output nodes are driven to two values, which are complementary to one another based on write data using high supply voltage (block 312).

Figure 4:
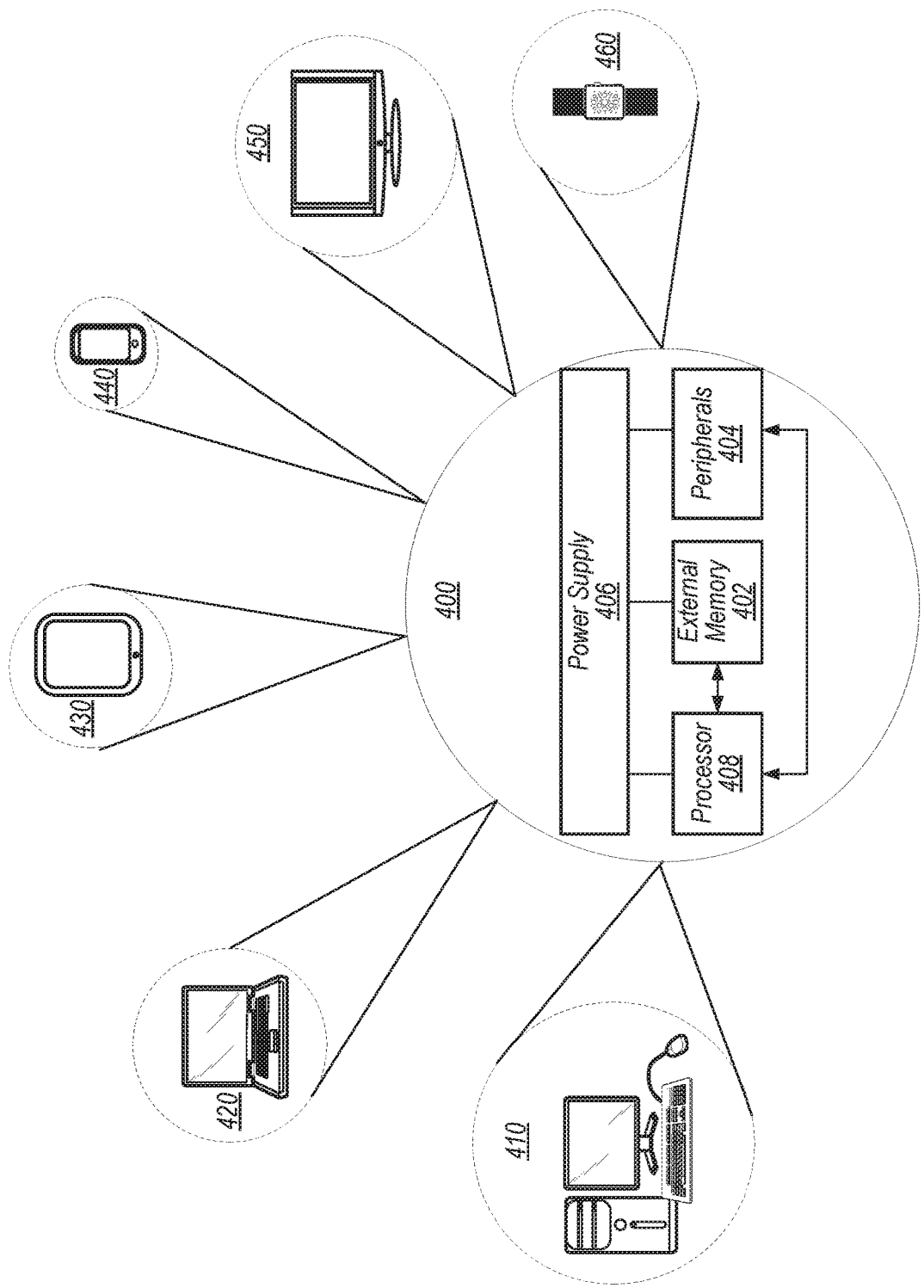
FIG. 4 is a block diagram of one embodiment of a system.

Turning next to FIG. 4, a block diagram of one embodiment of a system 400 is shown. As shown, system 400 may represent chip, circuitry, components, etc., of a desktop computer 410, laptop computer 420, tablet computer 430, cell or mobile phone 440, television 450 (or set top box configured to be coupled to a television), wrist watch or other wearable item 460, or otherwise. Other devices are possible and are contemplated. In the illustrated embodiment, the system 400 includes at least one instance of processor 408 which includes a processor portion and embedded memory. One or more of the processor 408 and the embedded memory use multiple write drivers such as write driver 100 (of FIG. 1). In an embodiment, processor 408 is coupled to an external memory 402. In various embodiments, processor 408 with embedded memory may be included within a system on chip (SoC) or integrated circuit (IC) which is coupled to external memory 402, peripherals 404, and power supply 406.

Processor 408 is coupled to one or more peripherals 404 and the external memory 402. A power supply 406 is also provided which supplies the supply voltages to processor 408 as well as one or more supply voltages to the memory 402 and/or the peripherals 404. In various embodiments, power supply 406 may represent a battery (e.g., a rechargeable battery in a smart phone, laptop or tablet computer). In some embodiments, more than one instance of processor 408 may be included (and more than one external memory 402 may be included as well).

The memory 402 may be any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAIVIBUS DRAM (RDRAM), static RAM (SRAM), etc. One or more memory devices may be coupled onto a circuit board to form memory modules such as single inline memory modules (SIMMs), dual inline memory modules (DIMMs), etc. Alternatively, the devices may be mounted with an SoC or IC containing processor 408 in a chip-on-chip configuration, a package-on-package configuration, or a multi-chip module configuration.

The peripherals 404 may include any desired circuitry, depending on the type of system 400. For example, in one embodiment, peripherals 404 may include devices for various types of wireless communication, such as Wi-Fi, Bluetooth, cellular, global positioning system, etc. The peripherals 404 may also include additional storage, including RAM storage, solid state storage, or disk storage. The peripherals 404 may include user interface devices such as a display screen, including touch display screens or multi-touch display screens, keyboard or other input devices, microphones, speakers, etc.

In various embodiments, program instructions of a software application may be used to implement the methods and/or mechanisms previously described. The program instructions may describe the behavior of hardware in a high-level programming language, such as C. Alternatively, a hardware design language (HDL) may be used, such as Verilog. The program instructions may be stored on a non-transitory computer readable storage medium. Numerous types of storage media are available. The storage medium may be accessible by a computer during use to provide the program instructions and accompanying data to the computer for program execution. In some embodiments, a synthesis tool reads the program instructions in order to produce a netlist comprising a list of gates from a synthesis library.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. An apparatus comprising:
    write driver circuitry configured to:
        receive a write data bit and a write mask bit, each configured to indicate a logic high level with a first voltage;
        receive a write clock signal configured to indicate a logic high level with a second voltage greater than the first voltage;
        generate an inverted value of the write clock signal, wherein the inverted value indicates a logic high level with the second voltage greater than the first voltage;
        generate an intermediate signal by combining the write data bit, the write mask bit, and the inverted value, wherein the intermediate signal indicates a logic high level with the first voltage; and
        generate complementary values on two output nodes based on the intermediate signal, wherein a logic high level of the complementary values is indicated by the second voltage.

2. The apparatus as recited in claim 1, wherein in response to detecting the write clock signal does not enable a write operation, the circuitry is configured to precharge each of the two output nodes to the second voltage.

3. The apparatus as recited in claim 1, wherein in response to detecting the write clock enables a write operation and the write mask bit does not enable a write operation, the circuitry is configured to prevent driving the two output nodes to either a logic low level or a logic high level.

4. The apparatus as recited in claim 1, wherein in response to detecting the write clock enables a write operation and the write mask bit enables a write operation, the two output nodes are driven to complementary values by an external random access memory (RAM) bit cell.

5. The apparatus as recited in claim 2, wherein the circuitry is further configured to generate a non-inverted write clock signal used to turn on precharge pfets connected to the two output nodes, wherein the non-inverted write clock signal indicates a logic high level with the second voltage.

6. The apparatus as recited in claim 5, wherein the circuitry is configured to:
    generate a first value of the complementary values by combining the write data bit, the write mask bit and an inverted value of the write clock signal in a Boolean NOR evaluation; and
    generate a second value of the complementary values by inverting the first value with a pfet with a source terminal connected to the second voltage and a gate terminal connected to the first value.

7. The apparatus as recited in claim 2, wherein prior to generation of the intermediate signal, each of the write data bit and the write mask bit are shifted by external redundancy logic configured to indicate a logic high level with the first voltage.

8. A method for driving level shifted write data comprising:
    receiving, by circuitry of a write driver, a write data bit and a write mask bit, each configured to indicate a logic high level with a first voltage;
    receiving, by circuitry of the write driver, a write clock signal configured to indicate a logic high level with a second voltage greater than the first voltage;
    generating, by circuitry of the write driver, an inverted value of the write clock signal, wherein the inverted value indicates a logic high level with the second voltage greater than the first voltage;

generating, by circuitry of the write driver, an intermediate signal by combining the write data bit, the write mask bit, and the inverted value, wherein the intermediate signal indicates a logic high level with the first voltage; and generating, by circuitry of the write driver, complementary values on two output nodes based on the intermediate signal, wherein a logic high level of the complementary values is indicated by the second voltage.

9. The method as recited in claim 8, wherein in response to detecting the write clock signal does not enable a write operation, the method further comprises precharging, by the circuitry, each of two output nodes of the write driver to the second voltage.

10. The method as recited in claim 8, wherein in response to detecting the write clock signal enables a write operation and the write mask bit does not enable a write operation, the method further comprises preventing, by the circuitry, driving the two output nodes to either a logic low level or a logic high level.

11. The method as recited in claim 8, wherein in response to detecting the write clock enables a write operation and the write mask bit enables a write operation, the two output nodes are driven to complementary values by an external random access memory (RAM) bit cell.

12. The method as recited in claim 9, further comprising generating, by the circuitry, a non-inverted write clock signal used to turn on precharge pfets connected to the two output nodes, wherein the non-inverted write clock signal indicates a logic high level with the second voltage.

13. The method as recited in claim 12, further comprising:
generating, by the circuitry, a first value of the complementary values by combining the write data bit, the write mask bit and an inverted value of the write clock signal in a Boolean NOR evaluation; and
generating, by the circuitry, a second value of the complementary values by inverting the first value with a pfet with a source terminal connected to the second voltage and a gate terminal connected to the first value.

14. The method as recited in claim 9, wherein prior to generation of the intermediate signal, each of the write data bit and the write mask bit are shifted by external redundancy logic configured to indicate a logic high level with the first voltage.

15. A memory comprising:
one or more arrays configured to store data;
a plurality of row decoders, each configured to select a given memory line stored in the one or more arrays based on a received request address; and
a plurality of write drivers, wherein at least a given write driver is configured to:

receive a write data bit and a write mask bit, each configured to indicate a logic high level with a first voltage;
receive a write clock signal configured to indicate a logic high level with a second voltage greater than the first voltage;
generate an inverted value of the write clock signal, wherein the inverted value indicates a logic high level with the second voltage greater than the first voltage;
generate an intermediate signal by combining the write data bit, the write mask bit, and the inverted value, wherein the intermediate signal indicates a logic high level with the first voltage; and
generate complementary values on two output nodes based on the intermediate signal, wherein a logic high level of the complementary values is indicated by the second voltage.

16. The memory as recited in claim 15, wherein the given write driver further comprises two output nodes, and wherein in response to detecting the write clock signal does not enable a write operation, the given write driver is configured to precharge each of the two output nodes to the second voltage.

17. The memory as recited in claim 15, wherein in response to detecting the write clock signal enables a write operation and the write mask bit does not enable a write operation, the given write driver is configured to prevent driving the two output nodes to either a logic low level or a logic high level.

18. The memory as recited in claim 15, wherein in response to detecting the write clock enables a write operation and the write mask bit enables a write operation, the two output nodes are driven to complementary values by an external random access memory (RAM) bit cell.

19. The memory as recited in claim 16, wherein the given write driver is further configured to generate a non-inverted write clock signal used to turn on precharge pfets connected to the two output nodes, wherein the non-inverted write clock signal indicates a logic high level with the second voltage.

20. The memory as recited in claim 19, wherein the given write driver is configured to:
generate a first value of the complementary values by combining the write data bit, the write mask bit and an inverted value of the write clock signal in a Boolean NOR evaluation; and
generate a second value of the complementary values by inverting the first value with a pfet with a source terminal connected to the second voltage and a gate terminal connected to the first value.

* * * * *